(12) United States Patent
Kaushik et al.

(10) Patent No.: US 9,665,510 B2
(45) Date of Patent: May 30, 2017

(54) SYNCHRONOUS BUS ARCHITECTURE FOR DIGITAL PRE-DISTORTION SYSTEM

(71) Applicants: Arvind Kaushik, Ghaziabad (IN); Peter Z. Rashev, Calgary (CA); Amrit P. Singh, Ludhiana (IN); Akshat Mittal, Greater Noida (IN)

(72) Inventors: Arvind Kaushik, Ghaziabad (IN); Peter Z. Rashev, Calgary (CA); Amrit P. Singh, Ludhiana (IN); Akshat Mittal, Greater Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 316 days.

(21) Appl. No.: 14/580,158

(22) Filed: Dec. 22, 2014

(65) Prior Publication Data

US 2016/0179715 A1 Jun. 23, 2016

(51) Int. Cl.
*G06F 13/24* (2006.01)
*G06F 13/28* (2006.01)
(Continued)

(52) U.S. Cl.
CPC .............. *G06F 13/24* (2013.01); *G06F 13/28* (2013.01); *H03F 1/3247* (2013.01); *Y02B 60/1228* (2013.01)

(58) Field of Classification Search
CPC ........ H03F 1/3247; H03F 1/3241; H03F 1/26; G06F 13/24; G06F 13/28; G06F 13/1668;
(Continued)

(56) References Cited

U.S. PATENT DOCUMENTS 5,900,778 A 5/1999 Stonick
7,577,211 B2 8/2009 Braithwaite
(Continued)

FOREIGN PATENT DOCUMENTS

WO 2010136114 12/2010

OTHER PUBLICATIONS

Lei Guan and Anding Zhu, Low-Cost FPGA Implementation of Volterra Series-Based Digital Predistorter for RF Power Amplifiers, IEEE Transactions on Microwave Theory and Techniques, vol. 58, No. 4, Apr. 2010.

*Primary Examiner* — Betsy Deppe
(74) *Attorney, Agent, or Firm* — Charles E. Bergere

(57) ABSTRACT

A system for storing pre-distorted output samples in a memory includes a sample counter, a programming interface module, and a comparator. The sample counter counts the pre-distorted output samples, generates a dynamic count value, receives a capture counter status signal, and generates a first count value. The programming interface module receives and outputs the first count value, an offset value, and a capture control signal, and generates a first interrupt signal. The comparator receives the first count value, the offset value, the dynamic count value, and the capture control signal, generates a final value, compares the final value with the dynamic count value, and generates a trigger signal when the final value equals the dynamic count value based on the capture control signal. The trigger signal initiates the storing of the pre-distorted output samples in the memory.

14 Claims, 4 Drawing Sheets

(51) Int. Cl.
*H03F 1/32* (2006.01)
*H04B 1/04* (2006.01)

(58) Field of Classification Search
CPC .............. G06F 13/1673; H04B 1/0475; H04B 2001/0425; H04B 2001/0433; G11C 7/1096; G11C 7/1078; G11C 7/10; G11C 7/106; H04L 25/49
See application file for complete search history.

(56) References Cited

U.S. PATENT DOCUMENTS

| | | | |
|---|---|---|---|
| 7,746,957 B2 | 6/2010 | Ishikawa | |
| 7,783,263 B2 | 8/2010 | Sperlich | |
| 7,796,960 B1 | 9/2010 | Rashev | |
| 8,030,997 B2* | 10/2011 | Brown | H03F 1/3247 330/136 |
| 8,111,101 B2* | 2/2012 | Brown | H03F 1/3247 330/149 |
| 8,243,852 B1* | 8/2012 | Summerfield | H04L 27/368 375/296 |
| 8,326,239 B1 | 12/2012 | Peiris | |
| 8,385,391 B2 | 2/2013 | Balasubramanian | |
| 2003/0058959 A1 | 3/2003 | Rafie | |
| 2004/0142667 A1 | 7/2004 | Lochhead | |
| 2012/0128098 A1 | 5/2012 | Haddad | |
| 2013/0162349 A1 | 6/2013 | Gao | |
| 2013/0243119 A1 | 9/2013 | Dalipi | |
| 2014/0009224 A1 | 1/2014 | Van Zelm | |
| 2014/0333377 A1* | 11/2014 | Peroulas | H03F 1/3247 330/149 |

\* cited by examiner

SYNCHRONOUS BUS ARCHITECTURE FOR DIGITAL PRE-DISTORTION SYSTEM

BACKGROUND OF THE INVENTION

The present invention relates generally to communications networks, and, more particularly, to a radio-frequency (RF) transceiver for a communications network.

A communications network includes multiple transmitters, receivers, and repeaters for exchanging information. To facilitate communications between transmitters and receivers separated by long distances, RF signals are used to carry the information between the transmitters and receivers. An RF communications network includes multiple mobile switching centers (MSCs), home location registers (HLRs), base station controllers (BSSs), base transceiver stations (BTSs), and user equipments (UEs). Terms such as MSC, BSS, BTS, and UE are technology standard specific and in this case are used in the Global System for Mobile communication (GSM) standard of wireless communication. The GSM BTS corresponds to Node-B in the third generation (3G) and eNode-B in the fourth generation (4G) wireless communication standards. The BTS facilitates communications between multiple UEs. The BTS includes an RF transceiver for transmitting and receiving RF signals to and from the UEs. The RF transceiver modulates a carrier wave by changing at least one of the characteristics of the carrier wave, viz. amplitude and frequency. The RF transceiver transmits the modulated carrier wave by way of an antenna.

FIG. 1 illustrates a conventional RF transceiver system 100. The RF transceiver system 100 includes an RF transceiver 102. The RF transceiver 102 includes a baseband processing unit 104, an RF integrated circuit (RFIC) 106, and a power amplifier (PA) 108. The RF transceiver system 100 further includes an antenna 110 that is connected to the PA 108. The baseband processing unit 104 includes digital signal processor (DSP) 112, a system bus 114, a digital pre-distorter (DPD) 116, an external direct memory access system (DMA) 118, a system memory 120, an event control block 122, and a first antenna interface 124. The RFIC 106 includes a second antenna interface 126, a digital-to-analog converter (DAC) 128, an analog-to-digital converter (ADC) 130, and a mixer 132.

The DSP 112 performs logical and mathematical operations on digital data to generate a series of digital data samples. The series of digital data samples includes information that is to be transmitted over the air to other devices. The DPD 116, the DMA 118, and the system memory 120 are connected to the DSP 112 by way of the system bus 114. The series of digital data samples is provided to the DPD 116 by way of the system bus 114. When the PA 108 operates at a high efficiency, linearity of the PA 108 is adversely affected as the PA 108 reaches a saturation point and generates a non-linear response.

The DPD 116 counters the non-linear response of the PA 108 by pre-distorting the series of digital data samples. The DPD 116 generates a series of pre-distorted samples based on the series of digital data samples. The pre-distorted samples, when provided as input to the PA 108, generate an output that is linear with respect to the digital data samples. The pre-distorted samples are provided to the DMA 118 for storage in the system memory 120.

The first antenna interface 124 is connected to the DPD 116 for receiving the series of pre-distorted samples. The second antenna interface 126 receives the series of pre-distorted samples from the first antenna interface 124. The DAC 128 and the ADC 130 are connected between the second antenna interface 126 and the mixer 132. The DAC 128 receives the pre-distorted samples from the second antenna interface 126 and generates an analog signal. The mixer 132 receives the analog signal from the DAC 128 and up-converts it for generating an RF signal.

The PA 108 is connected to the mixer 132 for receiving the RF signal and converting it to a high-power RF signal. The antenna 110 is connected to the PA 108 for receiving and then transmitting the high-power RF signal. The PA 108 sends the high-power RF signal back to the mixer 132 for down-converting. The mixer 132 generates an analog feedback signal based on the high-power RF signal. The analog feedback signal is provided to the ADC 130 for generating a digital feedback signal, which is provided to the second antenna interface 126. The second antenna interface 126 provides the digital feedback signal to the first antenna interface 124, which provides it to the system memory 120 by way of the DMA 118.

The system memory 120 stores the series of pre-distorted samples and the digital feedback signal. However, the feedback path from the PA 108 to the system memory 120 introduces a delay, and hence, the digital feedback signal arrives at the system memory 120 after the delay. Generally, the delay in the feedback path is estimated by calculating a correlation between the series of pre-distorted samples and the digital feedback signal. The correlation determines the extent of interdependence between the pre-distorted samples and the digital feedback signal.

In some cases, the delay is not an integral multiple of the time period of a digital data sample. The DSP 112 correlates the digital feedback signal and the pre-distorted samples to determine integral and fractional parts of the delay and calculate an estimated delay. The estimated delay is used to align the pre-distorted samples and the digital feedback signal. Correlation is a computationally intensive task and thus takes a lot of computing cycles, which degrades DSP performance. Further, the number of computing cycles required for correlation is dependent on the number of antennas, and hence, further increases for multiple-input multiple-output (MIMO) systems that use multiple antennas.

Therefore it would be advantageous to have an RF transceiver system for aligning pre-distorted samples and the digital feedback signal more efficiently.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
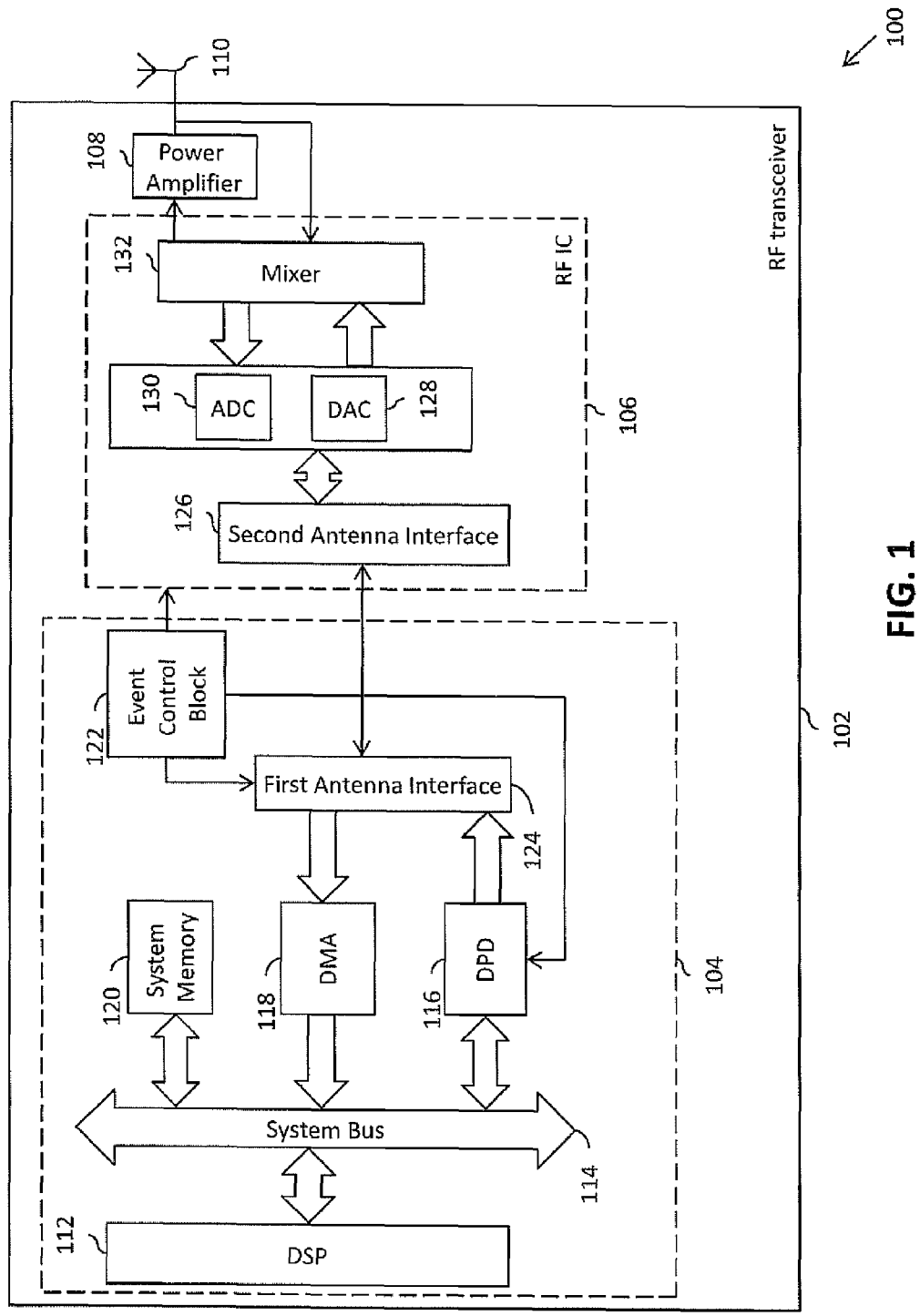
FIG. 1 is a schematic block diagram of a conventional radio-frequency (RF) transceiver.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a system for storing a plurality of output samples generated by a digital pre-distorter (DPD) in a memory is provided. The system includes a sample counter module, a programming interface module, and a comparator module. The sample counter module counts the plurality of output samples and generates a dynamic count value that is a count of the plurality of output samples. The sample counter module receives a capture counter status signal and generates a first count value that is a count of the plurality of output samples based on the capture counter status signal. The programming interface module receives and outputs the first count value, an offset value, and a capture control signal. The programming interface module generates a first interrupt signal based on the first count value. The first interrupt signal indicates the storing of the first count value and the capture control signal enables the storing of the plurality of output samples in the memory. The offset value and the first count value are collectively indicative of the dynamic count value at which the storing of the plurality of output samples is initiated. The comparator module receives the first count value, the offset value, the capture control signal, and the dynamic count value. The comparator module adds the first count value and the offset value for generating a final value, compares the final value and the dynamic count value, and generates a trigger signal when the final value equals the dynamic count value based on the capture control signal. The trigger signal initiates the storing of the plurality of output samples in the memory.

In another embodiment of the present invention, a digital pre-distorter (DPD) for generating and storing a plurality of output samples in a memory is provided. The DPD includes a sample counter module, a programming interface module, a comparator module, and a direct memory access (DMA) system. The sample counter module counts the plurality of output samples and generates a dynamic count value that is a count of the plurality of output samples. The sample counter module receives a capture counter status signal and generates a first count value that is a count of the plurality of output samples based on the capture counter status signal. The programming interface module receives and outputs the first count value, an offset value and a capture control signal. The programming interface module generates a first interrupt signal based on the first count value. The first interrupt signal indicates the storing of the first count value and the capture control signal enables the storing of the plurality of output samples in the memory. The offset value and the first count value are collectively indicative of the dynamic count value at which the storing of the plurality of output samples is initiated. The comparator module receives the first count value, the offset value, the capture control signal, and the dynamic count value. The comparator module adds the first count value and the offset value for generating a final value, compares the final value and the dynamic count value, and generates a trigger signal when the final value equals the dynamic count value based on the capture control signal. The trigger signal initiates the storing of the plurality of output samples in the memory. The DMA system receives the trigger signal and stores the output samples in the memory based on the trigger signal.

In yet another embodiment of the present invention, a method for storing output samples generated by a digital pre-distorter (DPD) in a memory is provided. The method includes counting the output samples to generate a dynamic count value. The method further includes receiving a capture counter status signal indicative of sampling the dynamic count value. A first count value that is a count of the output samples is generated based on the capture counter status signal. A first interrupt signal is generated when the first count value is generated. The method further includes receiving an offset value and a capture control signal. The offset value and the first count value are collectively indicative of the dynamic count value at which the storing of the output samples is initiated. The capture control signal enables the storing of the output samples in the memory. The first count value and the offset value are added to generate a final value. The final value and the dynamic count value are compared. A trigger signal is generated when the final value equals the dynamic count value based on the capture control signal. The trigger signal initiates the storing of the output samples in the memory.

Various embodiments of the present invention provide a system for storing a plurality of output samples generated by a digital pre-distorter (DPD) in a memory. The system includes a sample counter, a programming interface module, and a comparator. The sample counter counts the plurality of output samples and generates a dynamic count value. The sample counter receives a capture counter status signal and generates a first count value that is a count of the plurality of output samples based on the capture counter status signal. The programming interface module receives and outputs the first count value, an offset value and a capture control signal. The programming interface module generates a first interrupt signal based on the first count value. The first interrupt signal indicates the storing of the first count value and the capture control signal enables the storing of the plurality of output samples in the memory. The offset value and the first count value are collectively indicative of the dynamic count value at which the storing of the plurality of output samples is initiated. The comparator receives the first count value, the offset value, the capture control signal, and the dynamic count value, and adds the first count value and the offset value for generating a final value, compares the final value and the dynamic count value, and generates a trigger signal when the final value equals the dynamic count value based on the capture control signal. The trigger signal initiates the storing of the plurality of output samples in the memory.

The offset value enables the system to determine the starting position of the plurality of output samples stored in the memory and hence, enables the system to determine the sample boundaries of the output samples, thereby enabling the system to align the output samples with the corresponding feedback samples. The number of computational cycles required by the system for aligning the output samples corresponding to the integral part of the delay is reduced and hence, the efficiency of the system is increased.

Figure 2:
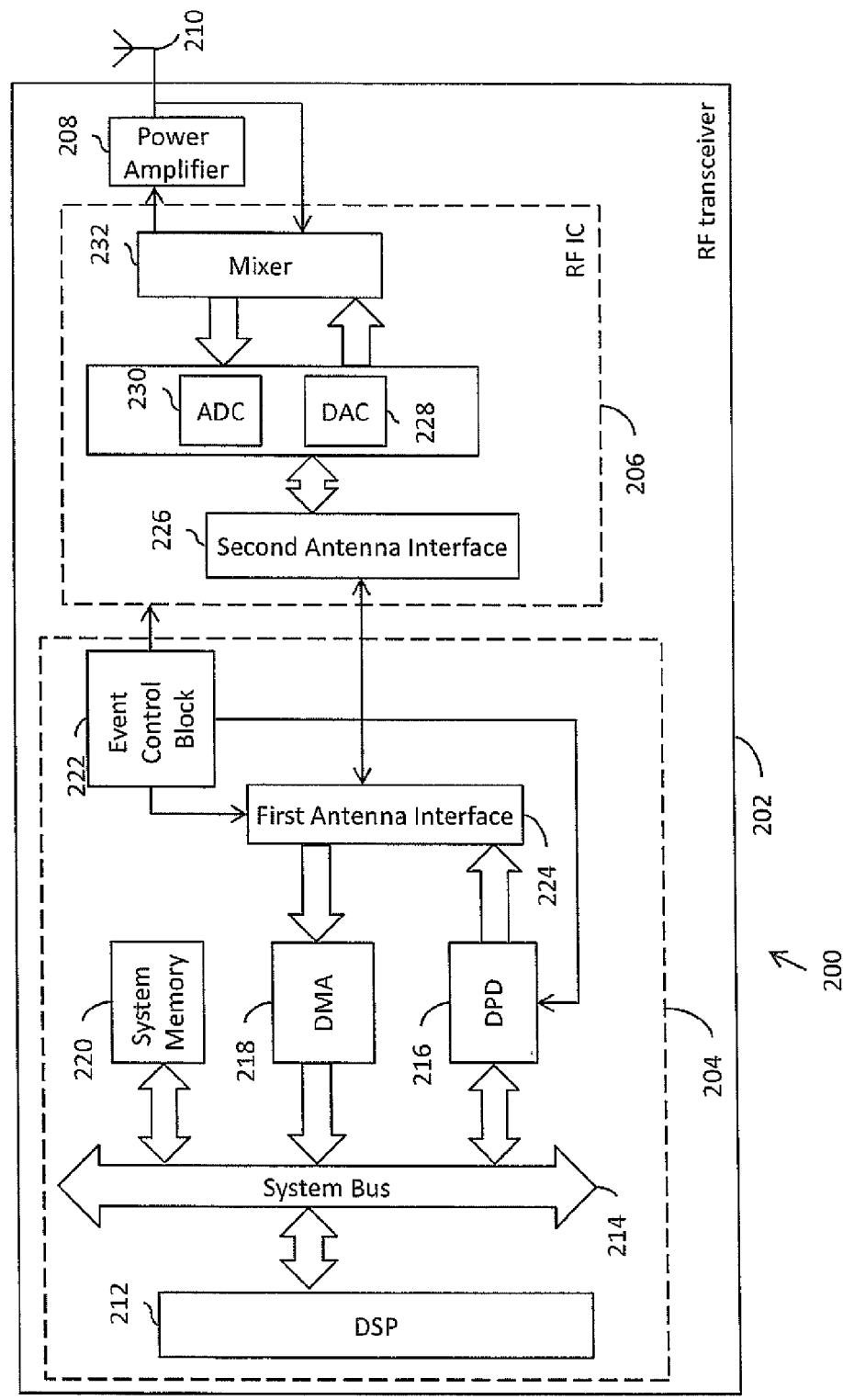
FIG. 2 is a schematic block diagram of a radio-frequency (RF) transceiver in accordance with an embodiment of the present invention.

Referring now to FIG. 2, a RF transceiver system 200 in accordance with an embodiment of the present invention is shown. The RF transceiver system 200 comprises an RF transceiver 202 that includes a baseband processing unit 204, an RFIC 206, and a power amplifier (PA) 208. The RF transceiver system 200 further includes an antenna 210 connected to the PA 208.

The baseband processing unit 204 includes a digital signal processor (DSP) 212, a system bus 214, a digital pre-distorter (DPD) 216, an external direct memory access (DMA) system 218, a system memory 220, an event control block 222, and a first antenna interface 224. The RFIC 206 includes a second antenna interface 226, a digital-to-analog converter (DAC) 228, an analog-to-digital converter (ADC) 230, and a mixer 232.

The DSP 212 performs logical and mathematical operations on digital data to generate a series of digital data samples. The DPD 216, the external DMA system 218, and the system memory 220 are connected to the DSP 212 by way of the system bus 214. The series of digital data samples is provided to the DPD 216 by way of the system bus 214. The DPD 216 generates a series of pre-distorted samples based on the series of digital data samples. The first antenna interface 224 is connected to the DPD 216 for receiving the series of pre-distorted samples. The series of pre-distorted samples is also provided simultaneously to the external DMA system 218 for storing the series of pre-distorted samples in the system memory 220.

The second antenna interface 226 is connected to the first antenna interface 224 for receiving the series of pre-distorted samples. The DAC 228 and the ADC 230 are connected between the second antenna interface 226 and the mixer 232. The DAC 228 receives the series of pre-distorted samples from the second antenna interface 226. The DAC 228 generates an analog signal based on the series of pre-distorted samples. The mixer 232 receives the analog signal from the DAC 228. The mixer 232 up-converts the analog signal for generating an RF signal based on the analog signal. The PA 208 is connected to the mixer 232 for receiving the RF signal. The antenna 210 is connected to the PA 208 for receiving the high-power RF signal. The antenna 210 then transmits the high-power RF signal over the air.

The PA 208 sends the high-power RF signal back to the mixer 232 for down-converting. The mixer 232 generates an analog feedback signal based on the high-power RF signal. The analog feedback signal is provided to the ADC 230 for generating a digital feedback signal based on the analog feedback signal. The digital feedback signal is provided to the second antenna interface 226. The second antenna interface 226 transmits digital feedback signal to the first antenna interface 224. The first antenna interface 224 stores the digital feedback signal in the system memory 220 by way of the system bus 214.

The PA 208, the antenna 210, the DSP 212, the system bus 214, the external DMA system 218, the system memory 220, the event control block 222, the first antenna interface 224, the second antenna interface 226, the DAC 228, the ADC 230, and the mixer 232 are structurally and functionally similar to the PA 108, the antenna 110, the DSP 112, the system bus 114, the external DMA system 118, the system memory 120, the event control block 122, the first antenna interface 124, the second antenna interface 126, the DAC 128, the ADC 130, and the mixer 132, respectively of FIG. 1.

Figure 3:
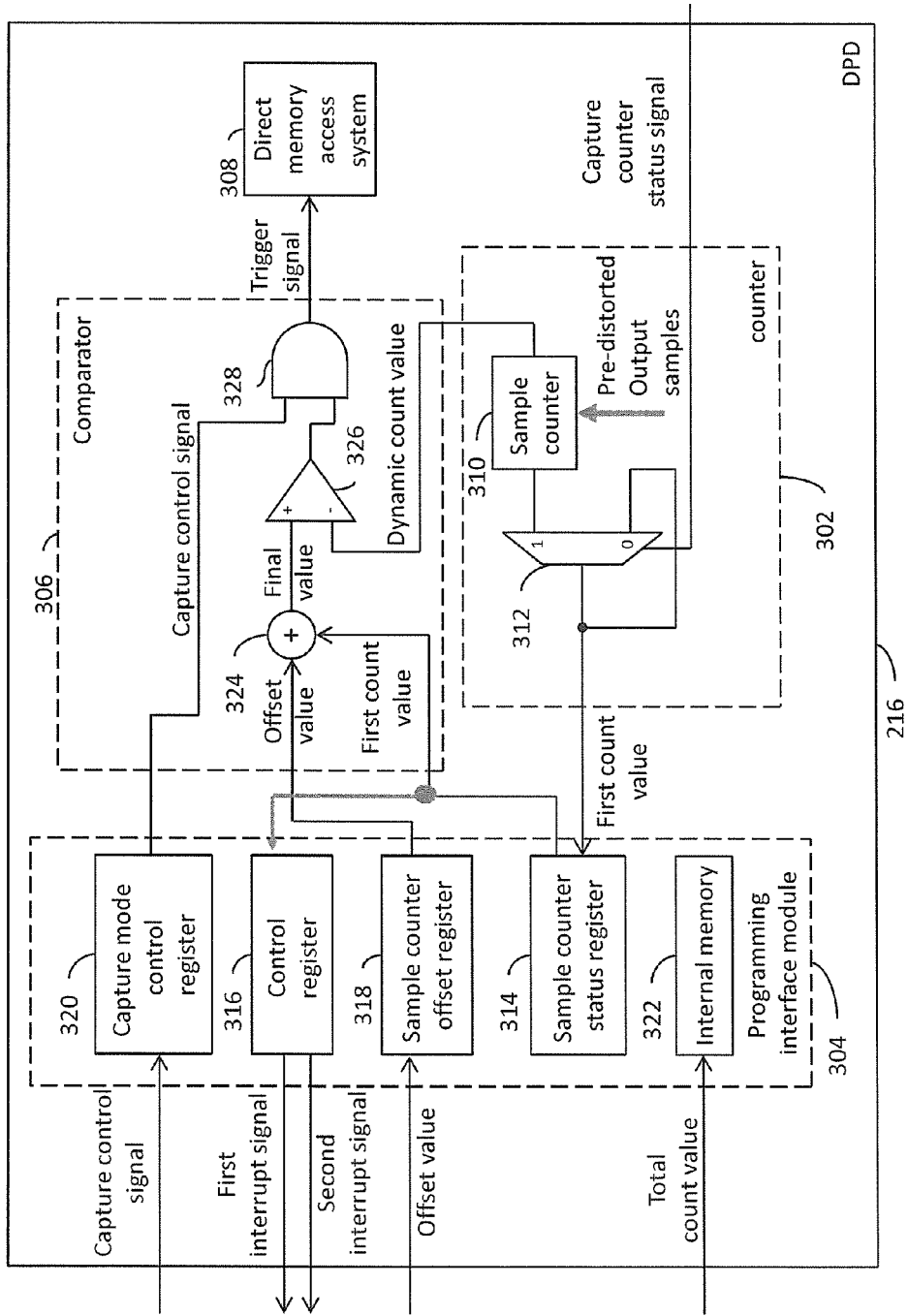
FIG. 3 is a schematic block diagram of a digital pre-distorter (DPD) of the RF transceiver of FIG. 2 in accordance with an embodiment of the present invention.

Referring now to FIG. 3, a schematic block diagram of the DPD 216 of the RF transceiver 202 of FIG. 2 in accordance with an embodiment of the present invention is shown. The DPD 216 includes a sample counter 302, a programming interface module 304, a comparator 306, and a direct memory access (DMA) system 308. The sample counter 302 includes a sample counter 310 and a mux 312. The programming interface module 304 includes a sample counter status register 314, a control register 316, a sample counter offset register 318, a capture mode control register 320, and an internal memory 322. The comparator 306 includes an adder 324, a comparator 326, and an AND gate 328.

The DPD 216 is included in the RF transceiver 202. The DPD 216 is used to nullify the non-linear characteristics of the PA 208. The DPD 216 pre-distorts an input signal to be provided to the PA 208 such that an output signal generated by the PA 208 based on a pre-distorted input signal is linear with respect to the input signal. The DPD 216 receives the series of digital data samples from the DSP 212 by way of the system bus 214 and pre-distorts the series of digital data samples for generating output samples.

The sample counter 310 counts the output samples and generates count values that are counts of the output samples. The sample counter 310 may comprise a synchronous counter, an asynchronous counter, a binary counter, or a decimal counter, and includes an internal counter memory (not shown); the sample counter 310 also may operate based on a clock signal. In one embodiment, the sample counter 310 is a 64 bit digital counter that generates a 64 bit count value of the output samples.

The mux 312 has a first input terminal connected to the sample counter 310 for receiving the count values, a second input terminal for receiving a first count value, a select terminal for receiving a capture counter status signal, and an output terminal for outputting the first count value based on the capture counter status signal. The first count value is a count of the output samples generated at a time instance when the mux 312 receives the capture counter status signal. In an example, the event control block 222 generates the capture counter status signal. The select terminal of the mux 312 is connected to the event control block 222 for receiving the capture counter status signal. In another example, the DSP 212 sends an event trigger signal to the event control block 222. The event control block 222 generates the capture counter status signal based on the event trigger signal.

The sample counter status register 314 is connected to the comparator 306 and the output terminal of the mux 312 for receiving the first count value. The sample counter status register 314 stores the first count value and outputs the first count value to the comparator 306.

The control register 316 is connected to the sample counter status register 314 for receiving the first count value and outputting a first interrupt signal based on the first count value. The first interrupt signal indicates the storing of the first count value in the sample counter status register 314. In an example, the control register 316 is connected to the DSP 212 by way of the system bus 214. The first interrupt signal is transmitted by the control register 316 to the DSP 212. Thus, the control register 316 enables the DSP 212 to determine that the first count value is generated by the sample counter 302 and stored in the sample count status register 314. In another example, the first interrupt signal is generated by setting a first interrupt bit of the control register 316 at a logic high state. The DSP 212 reads the first interrupt bit from the control register 316 by way of the system bus 214 to determine the generation of the first interrupt signal. Similarly, the control register 316 generates a second interrupt signal on completion of storing of the output samples in the system memory 220.

The sample counter offset register 318 receives and stores an offset value. Subsequently, the sample counter offset register 318 outputs the offset value to the comparator 306. The offset value and the first count value are collectively indicative of a dynamic count value at which the storing of the output samples is initiated. In an example, the sample counter offset register 318 is connected to the DSP 212 by way of the system bus 214 for receiving the offset value. The DSP 212 estimates the delay incurred in the feedback path from the PA 208 to the system memory 220 and calculates the offset value based on the estimated delay. In an embodiment of the present invention, the DSP 212 estimates the delay in the feedback path periodically to enhance the efficiency of the DPD 216.

The capture mode control register 320 receives a capture control signal. The capture control register 320 stores a capture control value based on the capture control signal, and outputs the capture control signal to the comparator 306. The capture control signal enables the storing of the output samples. In an example, the capture mode control register 320 is connected to the DSP 212 by way of the system bus 214. The DSP 212 generates and provides the capture control signal to the capture mode control register 320. In another example, the DSP 212 sets the capture control signal at logic high state to enable the storing of the output samples.

The internal memory 322 receives a total count value. The total count value is indicative of a count of the output samples to be stored in the system memory 220. In an example, the internal memory 322 is connected to the DSP 212 by way of the system bus 214 for receiving the total count value. In another example, the control register 316 generates the second interrupt signal when a count of the output samples stored in the system memory 220 equals the total count value.

In an example, the sample counter status register 314, the control register 316, the sample counter offset register 318, the capture mode control register 320, and the internal memory 322 are implemented using physical memory devices. Examples of physical memory devices include random access memory (RAM) and flash memories. In another example, the sample counter status register 314, the control register 316, the sample counter offset register 318, the capture mode control register 320, and the internal memory 322 are implemented using programmable memory devices. Examples of programmable memory devices include processor registers and erasable programmable read only memory (EPROM).

The adder 324 is connected to the sample counter status register 314 for receiving the first count value and to the sample counter offset register 318 for receiving the offset value. The adder 324 adds the first count value and the offset value and generates a final value indicative of a sum of the first count value and the offset value. Thus, the final value equals the dynamic count value. In an example, the first count value, the offset value and the final value are 64-bit digital values.

The comparator 326 has a first input terminal connected to the adder 324 for receiving the final value, a second input terminal connected to the sample counter 310 for receiving the count values, and an output terminal for generating a comparator output signal. As the sample counter 310 counts the output samples, the count values are sequentially incremented and the dynamic count value is output. The comparator 326 receives the final value and the dynamic count value and generates the comparator output signal to indicate that the final value and the dynamic count value are equal. In an example, the comparator 326 is a digital comparator. In another example, the comparator 326 is a digital identity comparator. The comparator output signal is at logic high state when the dynamic count value equals the final value and at logic low state when the dynamic count value is not equal to the final value.

The AND gate 328 has a first input terminal connected to the output terminal of the comparator 326 for receiving the comparator output signal, a second input terminal connected to the capture mode control register 320 for receiving the capture control signal, and an output terminal for outputting a trigger signal. The AND gate 328 provides the trigger signal to the DMA system 308. In the example, the capture control signal is at logic high state. The comparator 326 generates the logic high comparator output signal when the final value and the dynamic count value are equal. Thus, the AND gate 328 generates a logic high trigger signal to initiate storing of the output samples in the system memory 220.

The DMA system 308 receives the trigger signal. The DMA system 308 initiates the storing of the output samples into the system memory 220 by way of the system bus 214 based on the trigger signal. In one example, the external DMA system 218 is connected to the DPD 216 for receiving the trigger signal. The external DMA system 218 initiates the storing of the output samples into the system memory 220 based on the trigger signal.

In operation, the DPD 216 generates the output samples, i.e., the pre-distorted output samples after digital pre-distortion. The sample counter 310 counts the pre-distorted output samples to generate the count values. The mux 312 receives the capture counter status signal and the count values to generate the first count value. The sample counter status register 314 receives and stores the first count value and outputs the first count value to the comparator 306. The control register 316 receives the first count value from the sample counter status register 314 and generates the first interrupt signal. The sample counter offset register 318 receives and stores the offset value and outputs the offset value to the comparator 306. The capture mode control register 320 receives the capture control signal and transmits the capture control signal to the comparator 306. The adder 324 receives the first count and offset values and generates the final value. The comparator 326 receives and compares the final value and the dynamic count value to generate the comparator output signal. The AND gate 328 receives the comparator output signal and the capture control signal to generate the trigger signal. The DMA system 308 receives the trigger signal and initiates the storing of the pre-distorted output samples into the system memory 220. The control register 316 generates the second interrupt signal on completion of the storing of the pre-distorted output samples in the system memory 220.

Since the dynamic count value at which the storing of the output samples is initiated is determined by the DSP 212, the DSP 212 identifies the starting position of the pre-distorted output samples that are stored in the system memory 220, and hence, the DSP 212 identifies the sample boundaries of the pre-distorted output samples. Therefore, the DSP 212 utilizes less number of computing cycles to align the output samples with the feedback signal, and hence, the resources required by the DSP 212 for computation are reduced, thereby improving the performance of the DSP 212. Further, since the offset value is set by the DSP 212, the system allows a user to program the sample boundary of the captured pre-distorted output samples. The reduced number of computing cycles enables the DSP 212 to execute high-resolution sub-sample delay algorithms, thereby increasing the accuracy of the compensation provided for the delay in the feedback path. Further, the reduced number of computing cycles reduces the power consumption of the RF transceiver 202.

Figure 4:
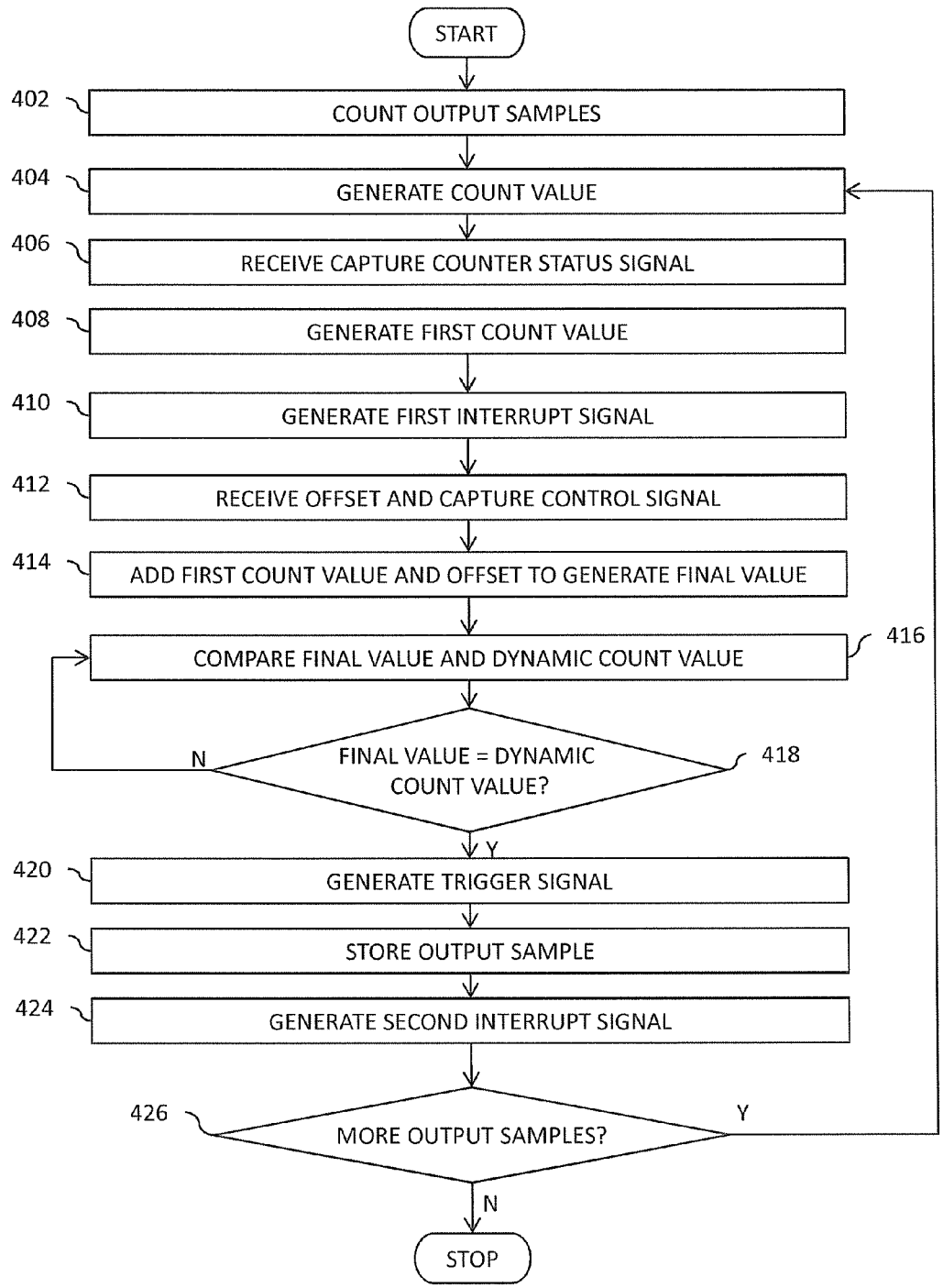
FIG. 4 is a flow chart illustrating a method for storing a plurality of output samples of a digital pre-distorter (DPD) in a memory in accordance with an embodiment of the present invention.

Referring now to FIG. 4, a flow chart illustrating a method for storing the output samples in accordance with an embodiment of the present invention is shown. FIG. 4 will be explained below in conjunction with FIGS. 2 and 3. At step 402, the sample counter 310 counts the output samples. At step 404, the sample counter 310 generates the count value that is a count of the output samples. At step 406, the mux 312 receives the capture counter status signal. At step 408, the mux 312 generates the first count value indicative of a count of the output samples generated based on the capture counter status signal. At step 410, the control register 316 generates the first interrupt signal indicative of storing the first count value in the sample counter status register 314. At step 412, the sample counter offset register 318 receives the offset value and the capture mode control register 320 receives the capture control signal. At step 414, the adder 324 adds the offset value and the first count value to generate the final value. At step 416, the comparator 326 compares the final value and the dynamic count value. At step 418, the comparator 326 determines whether the final value equals the dynamic count value.

If at step 418, the comparator 326 determines that the final value is equal to the dynamic count value, step 420 is executed. At step 420, the comparator 306 generates the trigger signal. At step 422, the DMA system 308 initiates the storing of the samples in the system memory 220. At step 424, the control register 316 generates the second interrupt signal upon completion of the storing of the output samples in the system memory 220. However, if at step 418, the comparator 326 determines that the final value is not equal to the dynamic count value, step 416 is executed.

At step 426, the sample counter 310 checks to determine whether there are any more samples. If at step 426, the sample counter 310 determines that there are more samples, step 404 is executed.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for storing a plurality of output samples generated by a digital pre-distorter (DPD) in a memory, comprising:
a sample counter module for counting the plurality of output samples, generating a dynamic count value that is a count of the plurality of output samples, receiving a capture counter status signal, and generating a first count value that is a count of the plurality of output samples based on the capture counter status signal;
a programming interface module connected to the sample counter module for receiving and outputting the first count value, receiving and outputting an offset value and a capture control signal, and generating a first interrupt signal based on the first count value, wherein the first interrupt signal indicates the storing of the first count value and the capture control signal enables the storing of the plurality of output samples in the memory, and wherein the offset value and the first count value are collectively indicative of the dynamic count value at which the storing of the plurality of output samples is initiated; and
a comparator module connected to the programming interface module for receiving the first count value, the offset value, and the capture control signal and to the sample counter module for receiving the dynamic count value, adding the first count value and the offset value for generating a final value, comparing the final value and the dynamic count value, and generating a trigger signal when the final value equals the dynamic count value based on the capture control signal, wherein the trigger signal initiates the storing of the plurality of output samples in the memory.

2. The system of claim 1, wherein the sample counter module comprises:
a sample counter for counting the plurality of output samples and generating the dynamic count value; and
a multiplexer having a first input terminal connected to the sample counter for receiving the dynamic count value, a second input terminal for receiving the first count value, a select terminal for receiving the capture counter status signal, and an output terminal connected to the programming interface module for outputting the first count value indicative of a count of the plurality of output samples generated based on the capture counter status signal.

3. The system of claim 2, wherein the programming interface module comprises:
a sample counter status register connected to the output terminal of the multiplexer for receiving and storing the first count value and outputting the first count value to the comparator module;
a sample counter offset register for receiving and storing the offset value and outputting the offset value to the comparator module;
a control register connected to the sample counter status register for receiving the first count value and outputting the first interrupt signal; and
a capture mode control register for receiving the capture control signal, storing a capture control value based on the capture control signal, and transmitting the capture control signal to the comparator module.

4. The system of claim 1, wherein the sample counter module, the programming interface module, and the comparator module are included in the DPD, and wherein the DPD further comprises a direct memory access (DMA) system for receiving the trigger signal and storing the plurality of output samples in the memory based on the trigger signal.

5. The system of claim 4, wherein the comparator module comprises:
an adder for receiving the first count value and the offset value and generating a sum of the first count value and the offset value as the final value;
a comparator having a first input terminal connected to the adder for receiving the final value, a second input terminal connected to the sample counter module for receiving the dynamic count value, and an output terminal for generating a comparator output signal; and
an AND gate having a first input terminal connected to the output terminal of the comparator for receiving the comparator output signal, a second input terminal connected to the programming interface module for receiving the capture control signal, and an output terminal for transmitting the trigger signal to the DMA system.

6. The system of claim 5, wherein the comparator output signal is at logic high state when the dynamic count value equals the final value.

7. The system of claim 4, wherein the programming interface module further generates a second interrupt signal when the DMA system completes storing the plurality of output samples in the memory.

8. The system of claim 4, wherein the programming interface module comprises an internal memory for receiving and storing a total count value indicative of a count of the plurality of output samples to be stored by the DMA system in the memory, and wherein the programming interface module generates a second interrupt signal when a count of the plurality of output samples stored by the DMA system in the memory equals the total count value.

9. A digital pre-distorter (DPD) for generating and storing a plurality of output samples in a memory, comprising:
- a sample counter module for counting the plurality of output samples, generating a dynamic count value that is a count of the plurality of output samples, receiving a capture counter status signal, and generating a first count value that is a count of the plurality of output samples based on the capture counter status signal;
- a programming interface module connected to the sample counter module for receiving and outputting the first count value, receiving and outputting an offset value and a capture control signal, and generating a first interrupt signal based on the first count value, wherein the first interrupt signal indicates the storing of the first count value and the capture control signal enables the storing of the plurality of output samples in the memory, and wherein the offset value and the first count value are collectively indicative of the dynamic count value at which the storing of the plurality of output samples is initiated;
- a comparator module connected to the programming interface module for receiving the first count value, the offset value, and the capture control signal and to the sample counter module for receiving the dynamic count value, adding the first count value and the offset value for generating a final value, comparing the final value and the dynamic count value, and generating a trigger signal when the final value equals the dynamic count value based on the capture control signal, wherein the trigger signal initiates the storing of the plurality of output samples in the memory; and
- a direct memory access (DMA) system for receiving the trigger signal and storing the plurality of output samples in the memory based on the trigger signal, and wherein the sample counter module comprises:
  - a sample counter for counting the plurality of output samples and generating the dynamic count value; and
  - a multiplexer having a first input terminal connected to the sample counter for receiving the dynamic count value, a second input terminal for receiving the first count value, a select terminal for receiving the capture counter status signal, and an output terminal connected to the programming interface module for outputting the first count value indicative of a count of the plurality of output samples generated based on the capture counter status signal.

10. The digital pre-distorter (DPD) of claim 9, wherein the programming interface module comprises:
- a sample counter status register connected to the output terminal of the multiplexer for receiving and storing the first count value and outputting the first count value to the comparator module;
- a sample counter offset register for receiving and storing the offset value and outputting the offset value to the comparator module;
- a control register connected to the sample counter status register for receiving the first count value and outputting the first interrupt signal; and
- a capture mode control register for receiving the capture control signal, storing a capture control value based on the capture control signal, and transmitting the capture control signal to the comparator module.

11. A method for storing a plurality of output samples generated by a digital pre-distorter (DPD) in a memory, comprising:
- counting the plurality of output samples;
- generating a dynamic count value that is a count of the plurality of output samples;
- receiving a capture counter status signal indicative of sampling the dynamic count value;
- generating a first count value that is a count of the plurality of output samples based on the capture counter status signal;
- generating a first interrupt signal when the first count value is generated;
- receiving an offset value and a capture control signal, wherein the offset value and the first count value are collectively indicative of the dynamic count value at which the storing of the plurality of output samples is initiated, and wherein the capture control signal enables the storing of the plurality of output samples in the memory;
- adding the first count value and the offset value to generate a final value;
- comparing the final value and the dynamic count value; and
- generating a trigger signal when the final value equals the dynamic count value based on the capture control signal, wherein the trigger signal initiates the storing of the plurality of output samples in the memory.

12. The method of claim 11, further comprising receiving the trigger signal and storing the plurality of output samples in the memory based on the trigger signal.

13. The method of claim 12, further comprising generating a second interrupt signal on completion of storing the plurality of output samples in the memory.

14. The method of claim 12, further comprising receiving a total count value indicative of a count of the plurality of output samples to be stored in the memory, and generating a second interrupt signal when a count of the plurality of output samples stored in the memory equals the total count value.

* * * * *